(12) United States Patent
Huang et al.

(10) Patent No.: US 9,960,130 B2
(45) Date of Patent: May 1, 2018

(54) RELIABLE INTERCONNECT

(71) Applicant: United Test and Assembly Center Ltd., Singapore (SG)

(72) Inventors: Rui Huang, Singapore (SG); Chun Hong Wo, Singapore (SG); Antonio Jr. Bambalan DiMaano, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days. days.

(21) Appl. No.: 14/615,436

(22) Filed: Feb. 6, 2015

(65) Prior Publication Data
US 2016/0233179 A1 Aug. 11, 2016

(51) Int. Cl.
*H01L 23/48* (2006.01)
*H01L 23/00* (2006.01)
*H01L 23/31* (2006.01)

(52) U.S. Cl.
CPC ............. *H01L 24/05* (2013.01); *H01L 24/03* (2013.01); *H01L 24/48* (2013.01); *H01L 23/3171* (2013.01); *H01L 24/32* (2013.01); *H01L 24/45* (2013.01); *H01L 24/73* (2013.01); *H01L 24/85* (2013.01); *H01L 2224/04042* (2013.01); *H01L 2224/05017* (2013.01); *H01L 2224/0519* (2013.01); *H01L 2224/0529* (2013.01); *H01L 2224/05124* (2013.01); *H01L 2224/05147* (2013.01); *H01L 2224/05393* (2013.01); *H01L 2224/05552* (2013.01); *H01L 2224/05558* (2013.01); *H01L 2224/05618* (2013.01); *H01L 2224/05644* (2013.01); *H01L 2224/05655* (2013.01); *H01L 2224/05664* (2013.01); *H01L 2224/2919* (2013.01); *H01L 2224/32225* (2013.01); *H01L 2224/45139* (2013.01); *H01L 2224/45144* (2013.01); *H01L 2224/45147* (2013.01); *H01L 2224/45164* (2013.01); *H01L 2224/48227* (2013.01); *H01L 2224/48453* (2013.01); *H01L 2224/48465* (2013.01); *H01L 2224/48507* (2013.01); *H01L 2224/73265* (2013.01)

(58) Field of Classification Search
CPC . H01L 2224/48463; H01L 2224/04042; H01L 2224/48247; H01L 2224/48227
See application file for complete search history.

(56) References Cited

U.S. PATENT DOCUMENTS

| | | | |
|---|---|---|---|
| 5,734,200 A * | 3/1998 | Hsue | H01L 24/03 257/751 |
| 6,417,029 B1 | 7/2002 | Fjelstad | |
| 6,476,491 B2 * | 11/2002 | Harada | H01L 24/03 257/758 |

(Continued)

*Primary Examiner* — Khiem D Nguyen
(74) *Attorney, Agent, or Firm* — Horizon IP PTE Ltd.

(57) ABSTRACT

Devices and methods for forming a device are disclosed. The device includes a contact region disposed over a last interconnect level of the device. The device includes a final passivation layer having at least an opening which at least partially exposes a top surface of the contact region and a buffer layer disposed at least over a first exposed portion of the top surface of the contact region. When an electrically conductive interconnection couples to the contact region, the buffer layer absorbs a portion of a force exerted to form an interconnection between the electrically conductive interconnection and the contact region.

22 Claims, 10 Drawing Sheets

(56) References Cited

U.S. PATENT DOCUMENTS

| | | | |
|---|---|---|---|
| 6,507,112 B1 * | 1/2003 | Kurihara | H01L 24/03 257/734 |
| 6,531,384 B1 * | 3/2003 | Kobayashi | H01L 24/03 257/E23.02 |
| 6,727,590 B2 * | 4/2004 | Izumitani | H01L 23/5226 257/208 |
| 6,800,555 B2 | 10/2004 | Test et al. | |
| 6,803,302 B2 | 10/2004 | Pozder et al. | |
| 7,638,418 B2 | 12/2009 | Bauer et al. | |
| 8,021,976 B2 | 9/2011 | Lee et al. | |
| 8,183,698 B2 | 5/2012 | Antol et al. | |
| 2005/0079651 A1 * | 4/2005 | Gleixner | H01L 24/03 438/107 |
| 2007/0045762 A1 * | 3/2007 | Nogami | H01L 21/76898 257/459 |
| 2007/0080452 A1 * | 4/2007 | Chi | H01L 24/10 257/737 |
| 2007/0273031 A1 * | 11/2007 | Lee | H01L 24/03 257/759 |
| 2008/0006951 A1 * | 1/2008 | Hebert | H01L 24/03 257/786 |
| 2008/0073792 A1 * | 3/2008 | Hosseini | H01L 24/03 257/762 |
| 2008/0211112 A1 * | 9/2008 | Wyland | H01L 23/5226 257/781 |
| 2010/0133688 A1 * | 6/2010 | Shigihara | H01L 24/05 257/738 |
| 2011/0192885 A1 | 8/2011 | Hochstenbach et al. | |
| 2013/0001777 A1 * | 1/2013 | Veychard | H01L 24/03 257/738 |

* cited by examiner

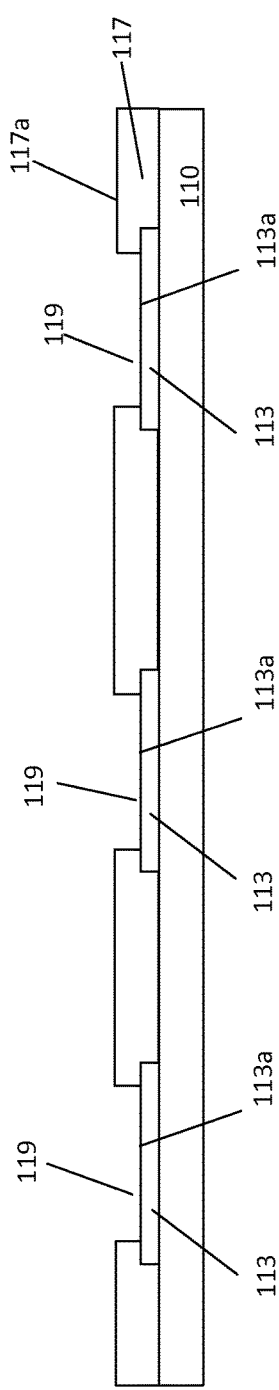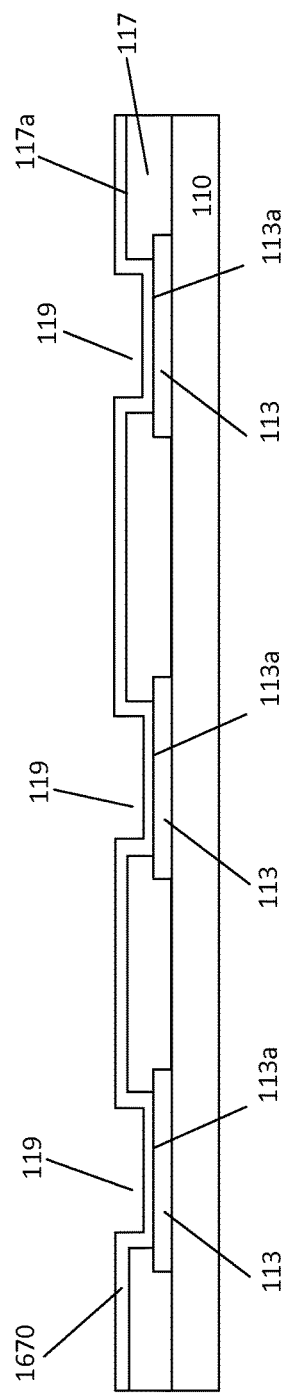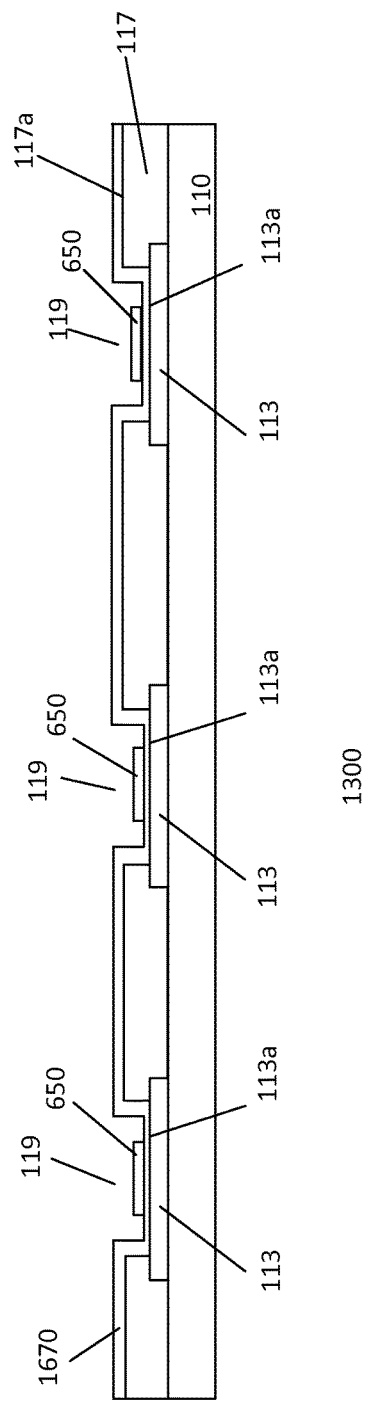

RELIABLE INTERCONNECT

BACKGROUND

It has always been desired to provide integrated circuit (IC) with low cost so as to meet customers' expectations. In addition, there is always a need to provide high speed IC by improving signal transmission speed by reducing RC time constant of signal propagation path. However, electrical or mechanical reliability of the IC, particularly interconnections of the IC, may be compromised while providing high speed IC.

From the foregoing discussion, it is desirable to provide reliable interconnects and to provide simplified and cost effective methods to form such reliable interconnects.

SUMMARY

Embodiments generally relate to semiconductor devices and methods of forming a semiconductor device. In one embodiment, a device is disclosed. The device includes a contact region disposed over a last interconnect level of the device. The device includes a final passivation layer having at least an opening which at least partially exposes a top surface of the contact region and a buffer layer disposed at least over a first exposed portion of the top surface of the contact region. When an electrically conductive interconnection couples to the contact region, the buffer layer absorbs a portion of a force exerted to form an interconnection between the electrically conductive interconnection and the contact region.

In another embodiment, a device is presented. The device includes a contact region and a buffer layer disposed over a last interconnect level of the device. The contact region and the buffer layer accommodate an electrically conductive interconnection. The device also includes a final passivation layer having at least an opening which at least partially exposes a top surface of the contact region. When an electrically conductive interconnection couples to the contact region, the buffer layer absorbs a portion of a force exerted to form an interconnection between the electrically conductive interconnection and the contact region.

In yet another embodiment, a method for forming a device is presented. A contact region is formed over a last interconnect level of the device. A final passivation layer having at least an opening which at least partially exposes a top surface of the contact region is formed. The method also includes forming a buffer layer at least over a first exposed portion of the top surface of the contact region. When an electrically conductive interconnection couples to the contact region, the buffer layer absorbs a portion of a force exerted to form an interconnection between the electrically conductive interconnection and the contact region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 12a-12e and FIGS. 13a-13e show various embodiments of a process for forming a semiconductor package.

DETAILED DESCRIPTION

Embodiments generally relate to semiconductor packages. For example, the packages have contact regions which are coupled to electrically conductive interconnections, such as but not limited to wire bonds. In some embodiments, at least one of the contact regions includes buffer layer disposed thereon. The contact regions, for example, can be bonded with copper wire. Such semiconductor packages are widely used in electronic devices. For example, the devices can be memory devices, wireless communication devices, or automobile controlling devices. The devices can be incorporated into consumer products, such as consumer electronic products. Incorporating the devices in other applications may also be useful.

Figure 1:
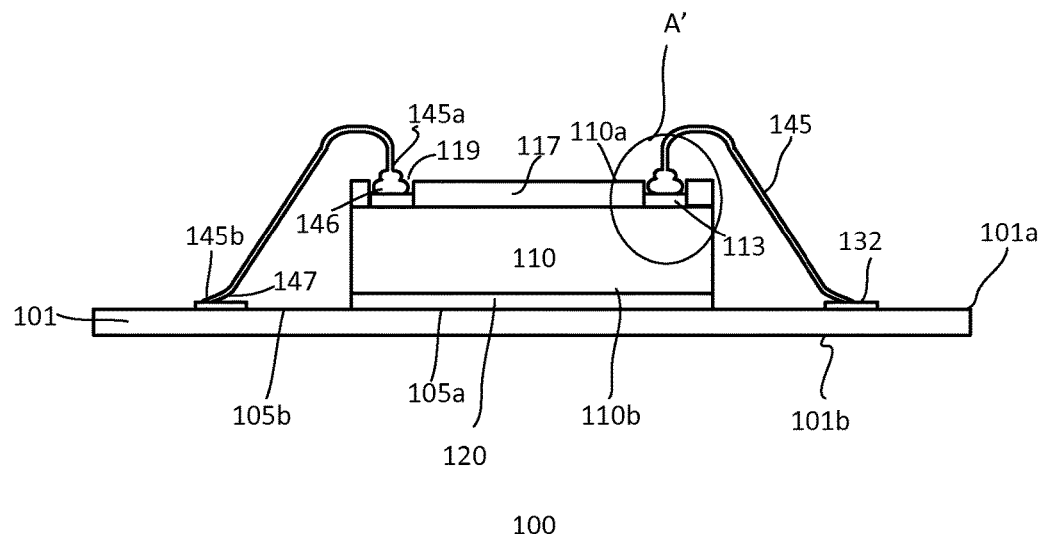
FIG. 1 shows a simplified cross-sectional view of an embodiment of a semiconductor package.

FIG. 1 shows a simplified cross-sectional view of a semiconductor package. The semiconductor package 100, as shown in FIG. 1, includes a package substrate 101. The package substrate includes first and second major surfaces 101a-101b. The first major surface 101a, for example, may be referred to as the top surface and the second major surface 101b, for example, may be referred to as the bottom surface. Other designations for the surfaces may also be useful. The package substrate may be a single layer substrate or a multi-layer substrate. Various materials, including but not limited to PCB substrate, polymer, ceramic, semiconductor, metal, etc., can be used to form the package substrate. The package substrate includes a plurality of conductive traces and via contacts (not shown) and a plurality of contact/bond pads 132 disposed at, for example, a non-die attach region 105b on the first major surface of the package substrate.

A semiconductor die or chip 110 is mounted on a die attach region 105a of the package substrate using an adhesive 120. The semiconductor chip can be any suitable types of semiconductor chip. The die, as shown, includes active and inactive major surfaces 110a-110b. The active surface 110a includes contact regions 113. The contact regions, in one embodiment, include die pads. The contact regions provide access to the internal circuitry (not shown) of the die. As shown, the die pads are located on the active major surface and the periphery of the die. Providing the die pads at other locations of the die can also be useful. A final passivation layer 117 is disposed and covers the active surface of the die, such as that shown in FIG. 1, except at the locations where die pads are disposed. As shown, the final passivation layer 117 may include openings 119 to at least partially expose the die pads.

The die, in one embodiment, is electrically connected to the package substrate by electrically conductive interconnections. The electrically conductive interconnections, in one embodiment, include wire bonds. Other suitable types of electrically conductive interconnections may also be useful. The wire bonds, in one embodiment, include conductive wires 145. In one embodiment, the conductive wires include Cu, Au, Ag, PdCu or any alloy thereof. Any other suitable types of conductive materials may also be used for the conductive wires. The wires, for example, are attached to die pads of the die and to contact pads 132 disposed on the non-die attach region 105b on the first major surface of the package substrate. In one embodiment, a first end 145a of the wire bond is bonded to the die pad so as to form a ball bond 146 while a second end 145b of the wire bond is bonded to the contact pad so as to form a stitch or wedge bond 147 as shown in FIG. 1. Other suitable types of wire bond configurations may also be useful. For instance, the wire bond configuration includes, but not limited to, stand-off stitch bond (SSB), reverse stand-off stitch bond (RSSB), etc.

Figure 2:
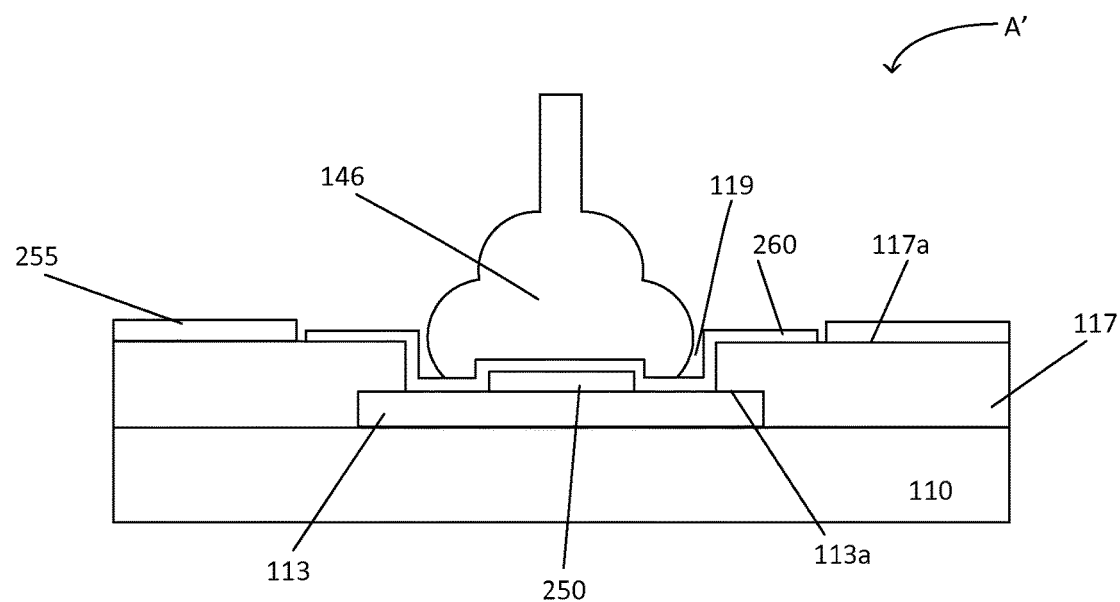
FIGS. 2-11 show various embodiments of a portion of a semiconductor package.

FIG. 2 shows simplified cross-sectional view of a portion A' of the semiconductor package 200 in greater detail in accordance with one embodiment. As described, a final passivation layer 117 is disposed and covers the active surface of the die except at the locations where contact regions 113, such as die pads, are disposed. The final passivation layer includes openings 119 to at least partially expose the top surface 113a of the die pads 113. The final passivation layer, for example, includes dielectric material, such as silicon dioxide ($SiO_2$) or silicon nitride. Other suitable types of dielectric material may also be useful. The contact regions, for example, include metallic contact pads, such as aluminum (Al), Cu or alloy thereof. Other suitable types of conductive materials may also be used for the contact regions.

In one embodiment, a buffer layer 250 is disposed over the contact region 113. The buffer layer 250, in one embodiment, covers a portion of the exposed surface of the contact region. As shown in FIG. 2, portions of the exposed top surface of the die pad not covered by the buffer layer remain exposed. The buffer layer, for example, is disposed over a central portion of the exposed surface of the die pad. The buffer layer may also be disposed at other portions of the contact region so long as it allows for forming electrical coupling between the contact region and the electrically conductive interconnection. For example, the buffer layer may be disposed at any suitable location over the exposed surface of the die pad as long as it allows for electrical contact between the die pad and the wire bond during the wire bonding process. The buffer layer, in one embodiment, includes a compliant material which is deformable when force is exerted thereon. For example, the buffer layer includes polyimide, B-stage material, polymer with filler content, etc. Other suitable types of compliant material may also be useful.

Referring to FIG. 2, a barrier layer 260 is disposed over the final passivation layer 117 and lines the opening of the final passivation layer. In one embodiment, the barrier layer 260 is disposed over a portion of the top surface 117a of the final passivation layer and lines the opening 119, including the sidewalls of the opening as well as exposed portions of the contact region and covering the buffer layer 250. The barrier layer, in one embodiment, includes a single layer barrier layer. In other embodiments, the barrier layer includes a multi-layered stack with more than one barrier layer. The barrier layer, in one embodiment, includes any suitable types of material(s) which can prevent the material of the electrically conductive interconnection from diffusing into the layers underneath the contact regions and provides a bondable surface for the electrically conductive interconnection. For example, the barrier layer includes material(s) which can prevent Cu diffusion and provides a bondable surface for the Cu wire bond, such as Ni, Pd, Au, Zn, alloys thereof, etc.

In some other embodiments, an additional buffer layer 255 may optionally be disposed over a portion of the top surface 117a of the final passivation layer. The additional buffer layer 255 may include the same or different buffer material as the buffer layer 250.

As shown in FIG. 2, the electrically conductive interconnection, such as the first end 145a of the wire bond having a ball bond 146 is bonded to the contact region, such as the die pad 113. The ball bond 146, in one embodiment, contacts the portion of barrier layer 260 disposed within the opening 119 of the final passivation layer 117. In one embodiment, a portion of the ball bond 146 is disposed over the buffer layer 250 and the remaining portions of the ball bond 146 are disposed over the exposed portions of the die pad 113 and contact the barrier layer 260. During the bonding process, the buffer layer 250 is deformed so as to absorb a portion of the force or energy exerted to form an intermetallic bond between the electrically conductive interconnection, such as the wire bond, and the barrier layer. This allows for reliable electrical and mechanical interconnection between the electrically conductive interconnection and the contact region to be formed without damaging the internal circuitry of the semiconductor die, including the metal interconnect network, inter-layer dielectric materials or semiconductor material, under the contact region. Furthermore, the barrier layer prevents the material of the electrically conductive interconnection from diffusing into the layers underneath the contact regions and provides a bondable surface for the electrically conductive interconnection. This avoids reducing carrier lifetime and maintains high transmission speed of the integrated circuit.

FIGS. 3 to 11 show simplified cross-sectional views of a portion A' of the semiconductor package in greater detail in accordance with various embodiments. Each of the portions of the semiconductor package shown in FIGS. 3 to 11 differs from the portion of the semiconductor package 200 shown in FIG. 2 in one or more aspects. Common elements may not be described or described in detail. In the interest of brevity, the description of FIGS. 3 to 11 below primarily focuses on the difference(s) between each of the portion of the semiconductor package with respect to the portion of the semiconductor package 200 in FIG. 2.

Figure 3:
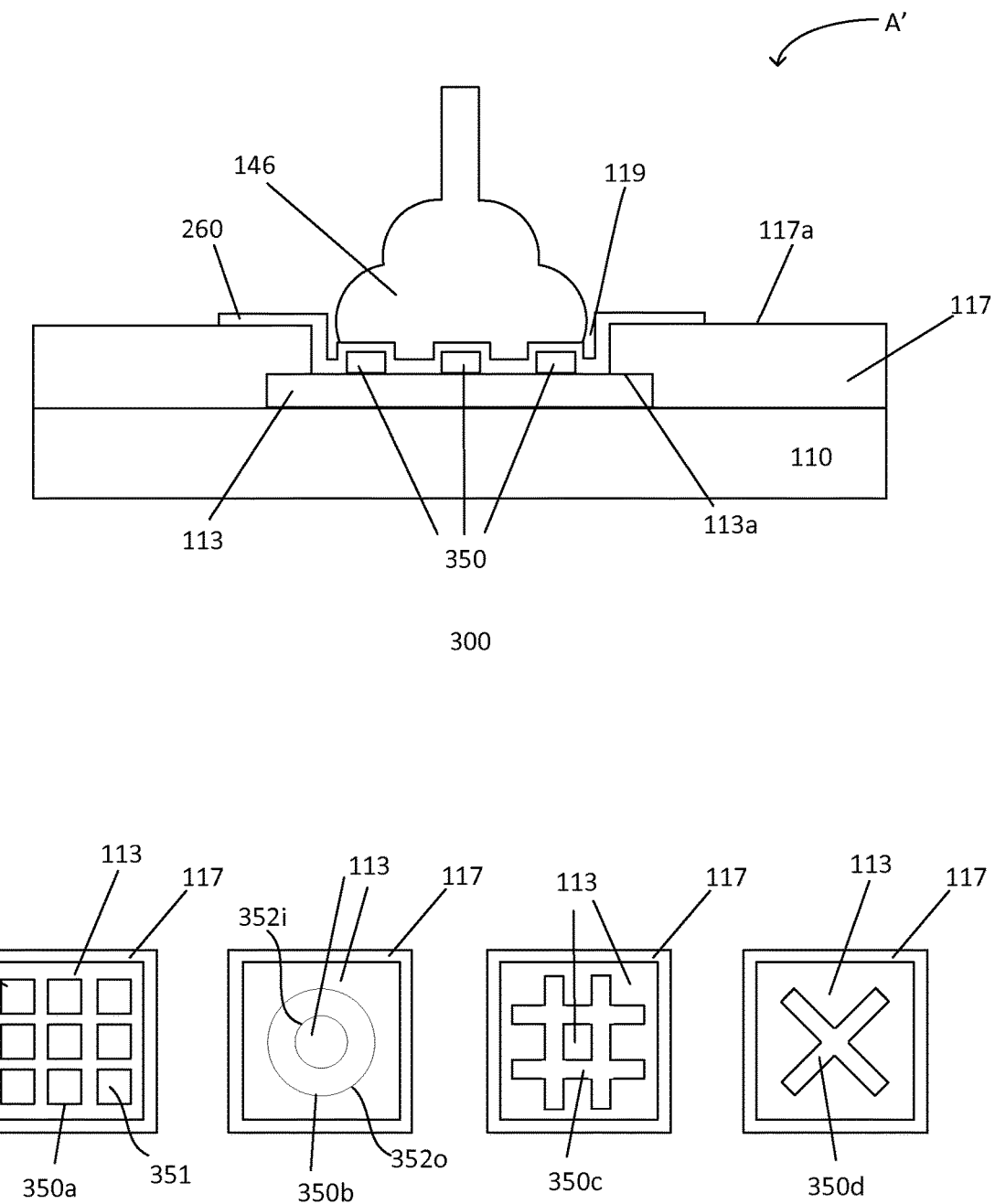

The portion A' of the semiconductor package 300, as shown in FIG. 3, illustrates a final passivation layer 117 being disposed and covers the active surface of the die. The final passivation layer 117 includes openings 119 which at least partially expose the top surface 113a of the contact regions, such as the die pads 113. As shown in FIG. 3, a buffer layer 350 is disposed over the contact region 113. The buffer layer 350 covers a portion of the contact region 113. In one embodiment, openings or gaps are formed within the buffer layer 350 so as to ensure a reliable electrical coupling between the contact region and the electrically conductive interconnection. A barrier layer 260 is disposed over a portion of the top surface 117a of the final passivation layer and lines the opening 119, including the sidewalls of the opening as well as exposed portions of the contact region and covering the buffer layer 250. The final passivation layer, the contact region, the buffer layer and the barrier layer, for example, include any suitable materials as described for these layers in FIG. 2.

The buffer layer 350, as shown in FIG. 3, includes a buffer layer having different shapes and forms relative to the buffer layer 250 as shown in FIG. 2. In one embodiment, the buffer layer 350 includes a first form 350a having a plurality of buffer regions being disposed over the contact region 113. The plurality of buffer regions of the first form 350a, in one embodiment, includes a plurality of square buffer regions 351. The square buffer regions, for example, include the same size. The square buffer regions, for example, are arranged in a 3×3 array. Providing other suitable shapes or other suitable dimensions and other configuration/arrangement for the plurality of buffer regions may also be useful. In another embodiment, the buffer layer 350 includes a second form 350b having a circular shape. The circular-shaped buffer layer 350b, for example, includes a ring shape. The buffer layer 350b, for example, includes an outer diameter 352o and an inner diameter 352i forming a hollow region exposing a portion of the contact region 113.

In yet other embodiments, the buffer layer includes a third form 350c or a fourth form 350d. The third form 350c of the buffer layer, in one embodiment, includes a pattern similar to a hash (#) shape or sign while the fourth form 350d, in one embodiment, includes a pattern similar to a cross (X) shape or sign. Other suitable types of pattern may also be useful. It is understood that the buffer layer 350 may be patterned or configured to have various forms and may be disposed over any suitable location over the contact region so long as it allows for electrical contact between the contact region and the electrically conductive interconnection and to provide maximum cushioning effect.

Figure 4:
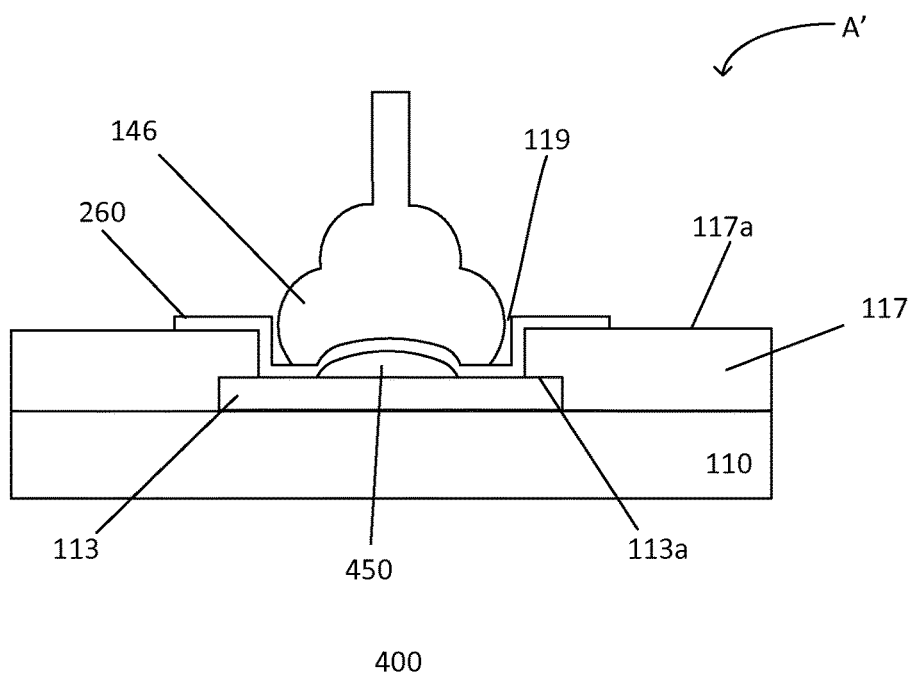
Figure 5:
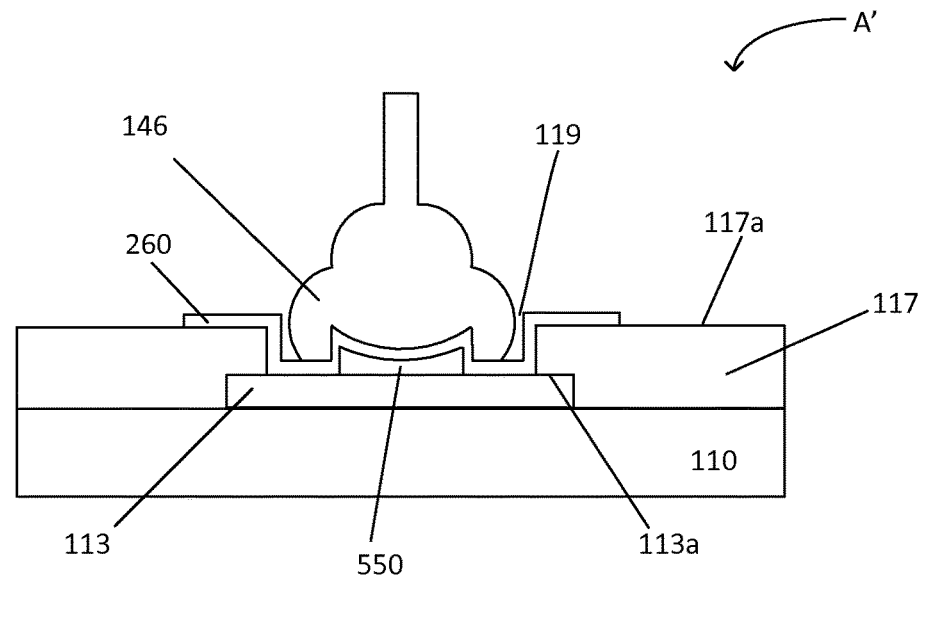

FIGS. 4 and 5 show different embodiments of a portion A' of the semiconductor package 400 and 500 in greater detail. As shown in FIGS. 4 and 5, a final passivation layer 117 is disposed and covers the active surface of the die. The final passivation layer 117 includes openings 119 which at least partially expose the top surface 113a of the contact regions, such as the die pads 113. As shown in FIGS. 4 and 5, a buffer layer 450 or 550 is disposed over the contact region 113. The buffer layer 450 or 550 covers a portion of the contact region 113. A barrier layer 260 is disposed over a portion of the top surface 117a of the final passivation layer and lines the opening 119, including the sidewalls of the opening as well as exposed portions of the contact region and covering the buffer layer 450 or 550. The final passivation layer, the contact region, the buffer layer and the barrier layer, for example, include any suitable materials as described for these layers in FIG. 2.

The buffer layer 450 or 550, as shown in FIGS. 4 and 5, includes a buffer layer having different profile for its upper surface relative to the buffer layer 250 as shown in FIG. 2. As shown in FIG. 2, the buffer layer 250 includes a top planar or flat surface. In one embodiment, the buffer layer 450 includes a top surface having convex profile as shown in FIG. 4. In another embodiment, the buffer layer 550 includes a concave profile in its upper surface as illustrated in FIG. 5. The buffer layer may have other suitable profiles for its upper surface, depending on various factors, such as the material of the buffer layer and its processing techniques. For example, if the buffer layer is made of B-stage material, a convex or concave profile may be formed on its upper surface. Such non-planar or non-flat upper surface profiles may also be formed by dispensing, screen printing, curing, coining process or any combination thereof during the formation of the buffer layer.

Figure 6:
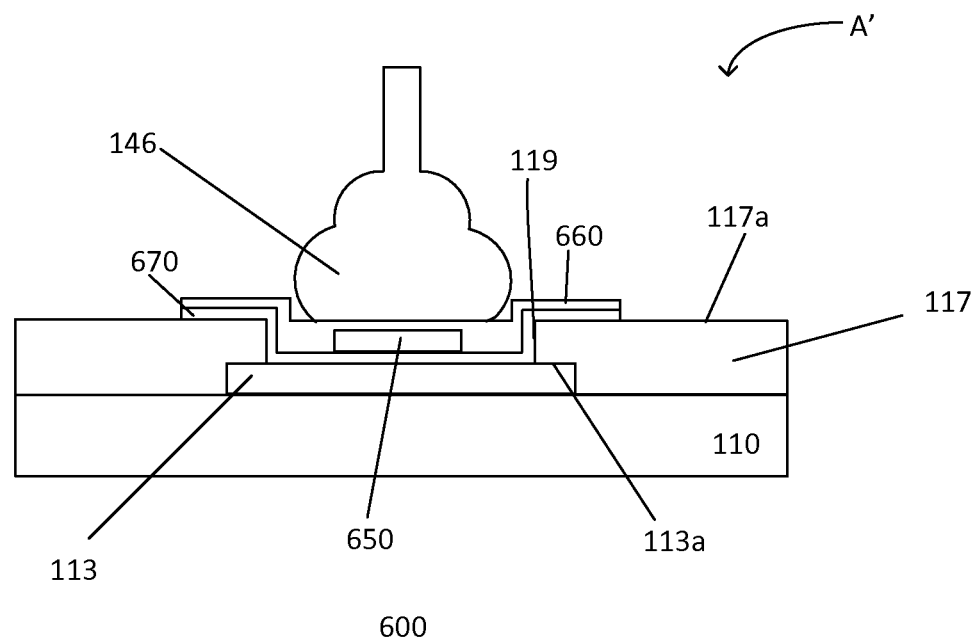
Figure 7:
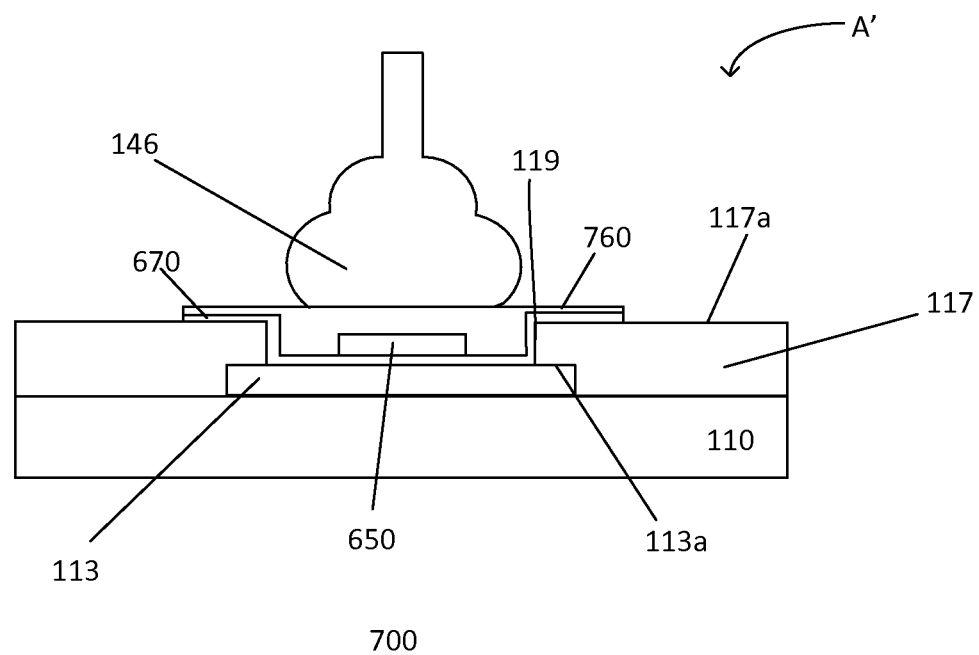

FIGS. 6 and 7 show various other embodiments of a portion A' of the semiconductor package 600 and 700 in greater detail. As illustrated in FIGS. 6 and 7, a final passivation layer 117 is disposed and covers the active surface of the die. The final passivation layer 117 includes openings 119 which at least partially expose the top surface 113a of the contact regions, such as the die pads 113. The final passivation layer and the contact region, for example, include any suitable materials as described for these layers in FIG. 2.

Different from the portion 200 as illustrated in FIG. 2, the portion 600 or 700 includes a conductive layer 670 disposed over a portion of the top surface 117a of the final passivation layer 117. As shown in FIGS. 6 and 7, the conductive layer 670 is disposed over a portion of the top surface 117a of the final passivation layer and lines the opening 119, including the sidewalls of the opening as well as exposed portions of the contact region 113. The conductive layer, in one embodiment, contacts the exposed portions of the contact region. The conductive layer 670, in one embodiment, includes a single layer conductive layer. The conductive layer may include a multi-layered stack having more than one conductive layer. The conductive layer 670, in one embodiment, serves as a seed layer. The conductive layer 670 may include any suitable types of material(s) which can serve as a seed layer for deposition of a barrier layer as will be described later. For example, the conductive layer includes Cu, AlCu, etc. Other suitable conductive materials may also be useful as long as it has good adhesion between the underlying contact region and final passivation layer as well as the barrier layer over it.

In one embodiment, a buffer layer 650 is disposed over the conductive layer 670. The buffer layer 650, in one embodiment, covers a portion of the conductive layer 670 which is over a portion of the exposed surface of the contact region. The buffer layer 650, for example, includes suitable buffer materials as described for the buffer layer 250 in FIG. 2. As such, common elements may not be described or described in detail.

In one embodiment, a barrier layer 660 or 760 is disposed over conductive layer 670 and the buffer layer 650. The barrier layer 660 or 760, for example, includes suitable materials as described for the barrier layer 260 in FIG. 2. In one embodiment, the barrier layer 660 is a partially conformal barrier layer as shown in FIG. 6. The upper surface of the barrier layer 660 includes a profile which is partially or fully conformal to the topography of the underlying layers. For example, the upper surface of the barrier layer 660 is conformal to the edges of the conductive layer and includes a recess having a bottom which is substantially coplanar with the top surface of the final passivation layer. In another embodiment, the upper surface of the barrier layer 760 includes an upper surface which is planar or flat as shown in FIG. 7. The barrier layer 760, for example, is disposed over the conductive layer and completely fills the remaining opening and covers the buffer layer 650.

Figure 8:
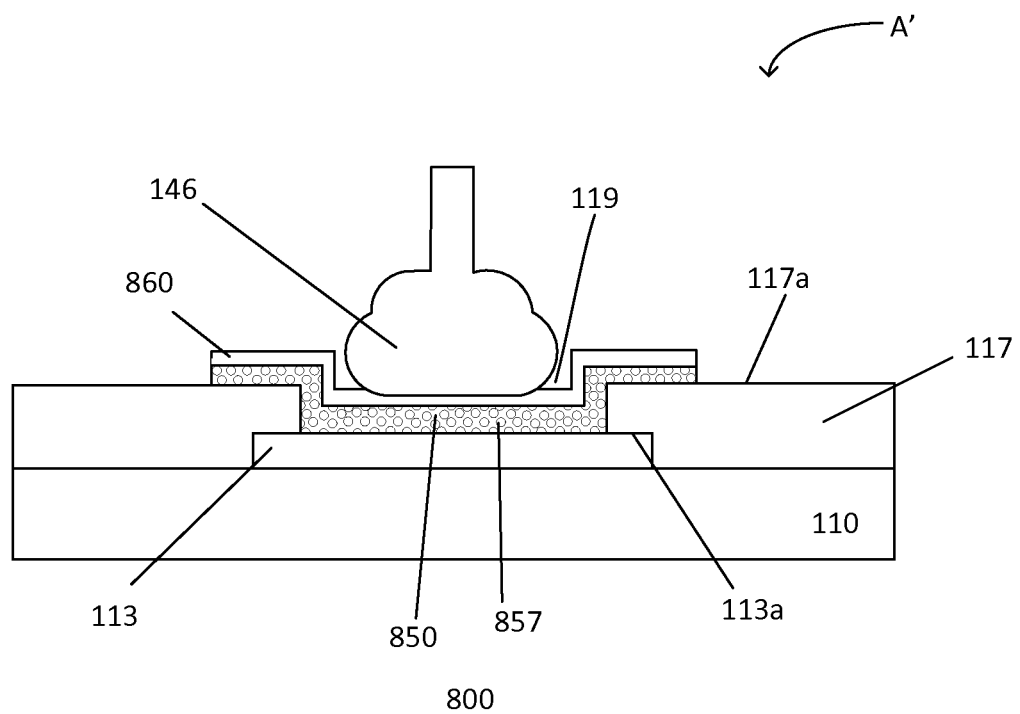

FIG. 8 shows another embodiment of a portion A' of the semiconductor package 800 in greater detail. As shown in FIG. 8, a final passivation layer 117 is disposed and covers the active surface of the die. The final passivation layer 117 includes openings 119 which at least partially expose the top surface 113a of the contact regions, such as the die pads 113. The final passivation layer and the contact region, for example, include any suitable materials as described for these layers in FIG. 2. For example, the contact region 113 includes a metallic contact pad.

Different from the portion 200 as illustrated in FIG. 2, the portion 800 includes a buffer layer 850 disposed over a portion of the top surface 117a of the final passivation layer 117. As shown in FIG. 8, the buffer layer 850 is disposed over a portion of the top surface 117a of the final passivation layer and lines the opening 119, including the sidewalls of the opening as well as exposed portions of the contact region 113. The buffer layer 850, in one embodiment, contacts the exposed portions of the contact region. The buffer layer 850, in one embodiment, includes a buffer layer with filler content. The buffer layer, in one embodiment, includes the compliant material as described in FIG. 2 and further includes a plurality of filler materials 857. The compliant material, for example, includes polymer while the filler materials include conductive particles or pillars, such as Ag, Cu or alloy thereof. Other suitable materials may also be useful.

In one embodiment, a barrier layer 860 is disposed over the buffer layer 850. The barrier layer 860, for example, includes suitable materials as described for the barrier layer 260 in FIG. 2. In one embodiment, the barrier layer 860 is a conformal barrier layer as shown in FIG. 8. The upper surface of the barrier layer 860 includes a profile which is conformal to the topography of the underlying layer. The upper surface of the barrier layer 860 may also include other suitable profiles, such as a profile which is non-conformal with topography of the underlying layers.

Figure 9:
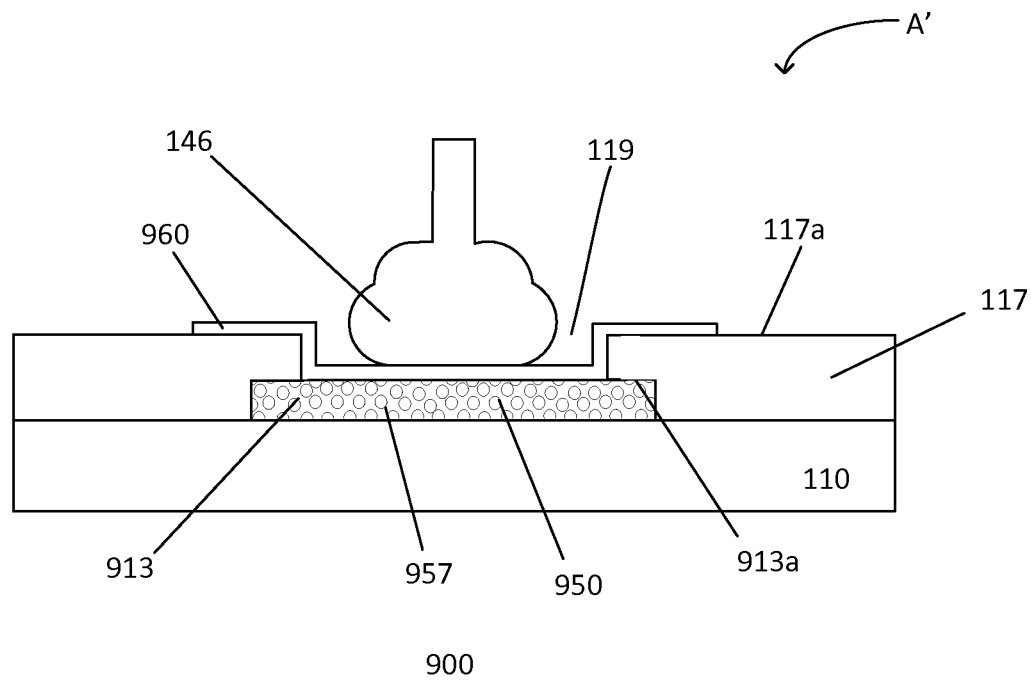

FIG. 9 shows another embodiment of a portion A' of the semiconductor package 900 in greater detail. As shown in FIG. 9, a final passivation layer 117 is disposed and covers the active surface of the die. The final passivation layer 117 includes openings 119 which at least partially expose the top surface 913a of the contact regions 913. The final passivation layer, for example, includes any suitable materials as described for this layer in FIG. 2.

Different from the portion 200 as illustrated in FIG. 2, the contact region 913 of the portion 900 is not a metallic contact pad. In one embodiment, the contact region is a buffer layer 950 with filler content 957. In this embodiment, the buffer layer with filler content serves as the contact region for electrically conductive interconnections to be disposed thereon. This allows for a thinner and simplified semiconductor package to be formed. The buffer layer 950 with filler content, for example, includes the same compliant and filler materials as described in FIG. 8 above. In one embodiment, a barrier layer 960 is directly disposed over the contact region 913 having the buffer layer 950 with filler content 957. The barrier layer 960, for example, includes suitable materials as described for the barrier layer 260 in FIG. 2. In one embodiment, the barrier layer 960 is a conformal barrier layer as shown in FIG. 9. The barrier layer 960, in one embodiment, is disposed over a portion of the top surface 117a of the final passivation layer 117 and lines the opening 119, including sidewalls of the opening and covers the exposed top surface of the contact region 913a.

The use of a buffer layer with filler content as described in, for example, FIGS. 8 and 9 above allows for electrical coupling between the electrically conductive interconnection and the buffer layer with filler content to be established when the buffer layer is pressed.

Figure 10:
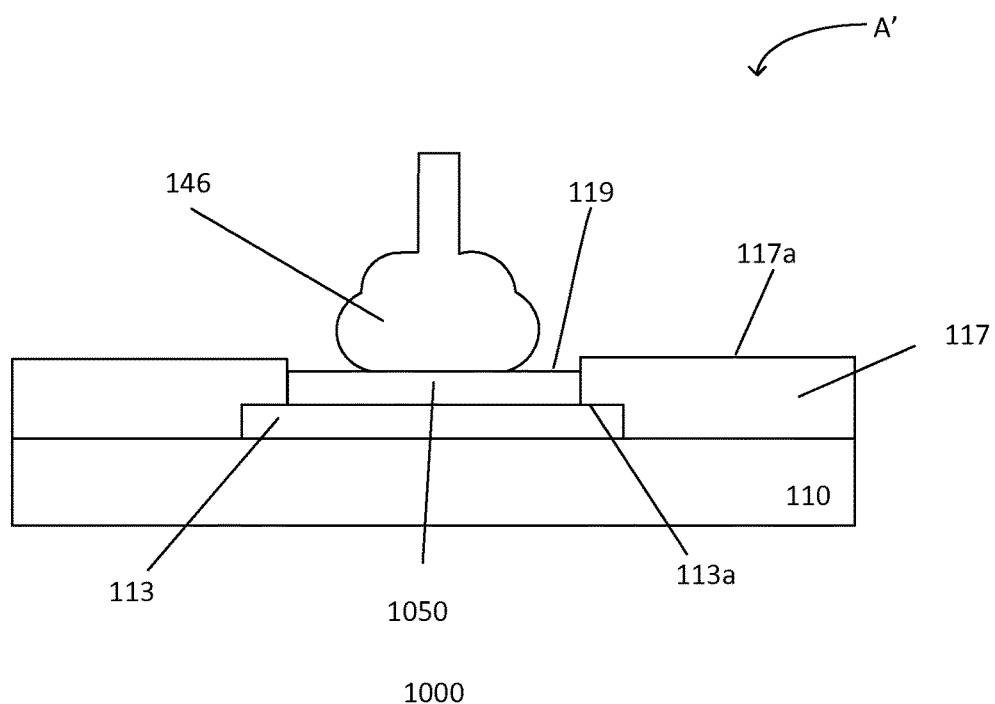

FIG. 10 shows another embodiment of a portion A' of the semiconductor package 1000 in greater detail. As shown in FIG. 10, a final passivation layer 117 is disposed and covers the active surface of the die. The final passivation layer 117 includes openings 119 which at least partially expose the top surface 113a of the contact regions, such as the die pads 113. The final passivation layer and the contact region, for example, include any suitable materials as described for these layers in FIG. 2. For example, the contact region 113 includes a metallic contact pad.

Different from the portion 200 as illustrated in FIG. 2, the portion 1000 includes a buffer layer 1050 disposed within the opening 119 and over the contact region 113. In one embodiment, the buffer layer 1050 is disposed over the exposed top surface of the contact region and contacts the sidewalls of the opening. The buffer layer 1050, in one embodiment, includes a material which exhibit high strength and stiffness, high charge mobility and high thermal conductivity or with high electrical conductivity, low resistance and mechanical compliance for semiconductor applications. The buffer layer 1050, in one embodiment, includes graphene or carbon nanotube layer. The carbon nanotube layer, for example, has no grain boundaries over their length of ten nanometers to a few millimeters. This allows for excellent deformability and elasticity and compliance relative to buffer materials having metallic particles. Other suitable materials having the properties above may also be useful. In this embodiment, the buffer layer 1050 itself may also function as a barrier layer. As such, no barrier layer is disposed over the buffer layer and/or the contact region.

Figure 11:
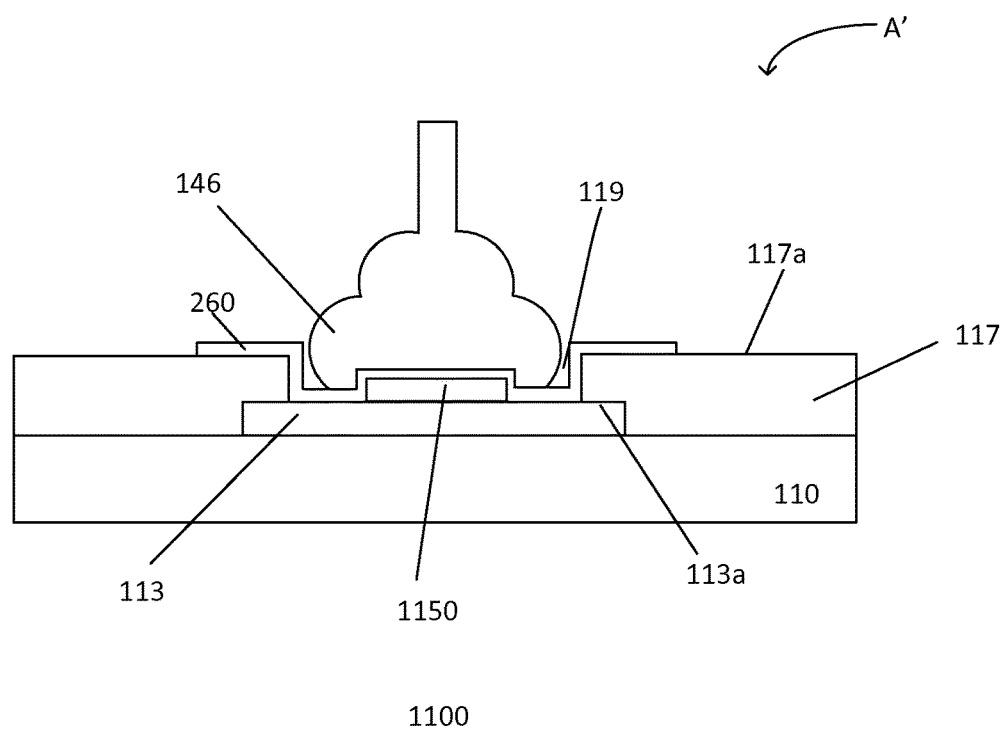

FIG. 11 shows another embodiment of a portion A' of the semiconductor package 1100 in greater detail. As shown in FIG. 9, a final passivation layer 117 is disposed and covers the active surface of the die. The final passivation layer 117 includes openings 119 which at least partially expose the top surface 113a of the contact regions 113. The final passivation layer and the contact region, for example, include any suitable materials as described for these layers in FIG. 2.

A buffer layer 1150 is disposed over a portion of the exposed surface of the contact region as shown in FIG. 11. Different from the portion 200 as illustrated in FIG. 2, the buffer layer 1150 of the portion 1100, in one embodiment, includes a material which is the same as that described in FIG. 10. As such, the material of the buffer layer 1150 will not be described. Similar to the portion 200, a barrier layer 260 is disposed over a portion of the top surface 117a of the final passivation layer 117 and lines the opening 119, including sidewalls of the opening and covers the exposed top surface of the contact region 113a.

The embodiments, as described in FIGS. 2-11, show a portion of a semiconductor with differing configurations of the buffer layer, the barrier layer or contact region. It is understood that any of the embodiments as described in FIGS. 2-11 may be modified or rearranged to include different combinations of the features as described in FIGS. 2-11.

FIGS. 12a-12e show an embodiment of a process 1200 for forming a portion of a semiconductor package. The portion of the semiconductor package formed is similar to that described in FIG. 2. Common elements may not be described or described in detail. As shown, a partially processed substrate is provided. The partially processed substrate can be in the form of a wafer or a semiconductor die or chip. The partially processed substrate includes a substrate and multiple levels of metal layers that has been processed up to, for example, the last metal layer (not shown) of the interconnect level of a semiconductor die or wafer 110. The different levels of the metal layers are separated by a plurality of dielectric layers. The substrate includes a semiconductor material, such as silicon, and has circuit components (not shown) such as transistors formed thereon. The metal layers include, for example, Cu, W or alloy thereof, while the dielectric layers include suitable dielectric materials, such as Sift, depending on the level of the interconnect level. The partially processed substrate is processed using any suitable front end of line and back end of line techniques and therefore will not be described or described in detail.

The last interconnect level having the last metal layer and dielectric layer is overlaid with a conductive layer. The conductive layer, in one embodiment, includes a metallic layer. The metallic layer, for example, includes Al, Cu or alloy thereof. The conductive layer is formed over the last interconnect level by suitable deposition techniques, such as physical vapor deposition (PVD), chemical vapor deposition (CVD) or atomic layer deposition (ALD). Other suitable deposition techniques may also be used. The conductive layer may be patterned to form a plurality of contact regions 113 by suitable mask and etch techniques. The contact regions 113, in one embodiment, are die pads. The contact regions accommodate electrically conductive interconnections (not shown) which are electrically connected to a package substrate (not shown) and provide access to the internal circuitry (not shown) of the die. The electrically conductive interconnections, in one embodiment, are wire bonds. Other suitable types of electrically conductive interconnections may also be useful. It is understood that an electrical test may optionally be performed by probing on the contact regions at this stage.

Figure 12A:
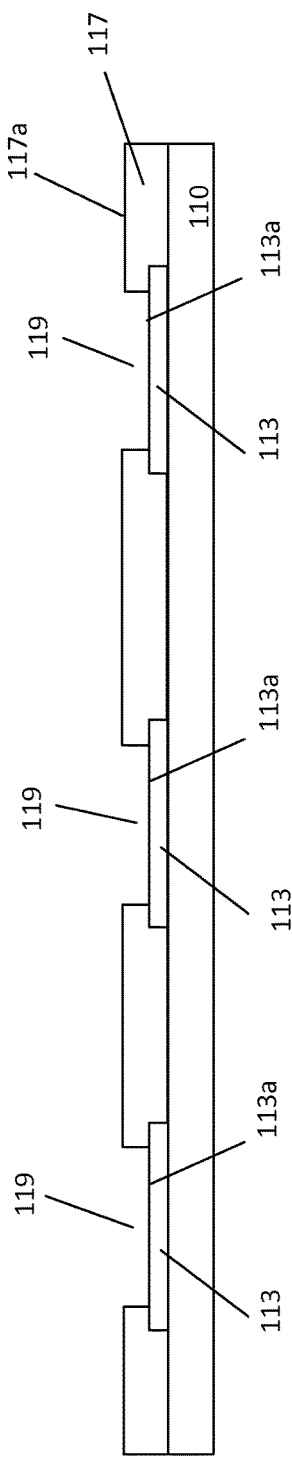

Referring to FIG. 12a, a final passivation layer 117 is blanket deposited over the contact regions 113. The final passivation layer, for example, includes dielectric material, such as $SiO_2$. The final passivation layer is deposited over the contact regions 113 by CVD or PVD. Other suitable types of dielectric materials and deposition techniques may also be used. The final passivation layer has sufficient thickness and covers the contact regions. The process continues to form openings 119 in the final passivation layer 117. For example, the final passivation layer is patterned to form openings 119 to at least partially expose the top surface 113a of the contact regions 113. The patterning includes suitable mask and etch techniques. The width of the openings, for example, is smaller than the width of the contact regions. Other suitable configuration for the openings may also be useful. It is understood that an electrical test may be performed after forming the openings in the passivation layer where probe marks may be formed in the contact regions at this stage.

Figure 12B:
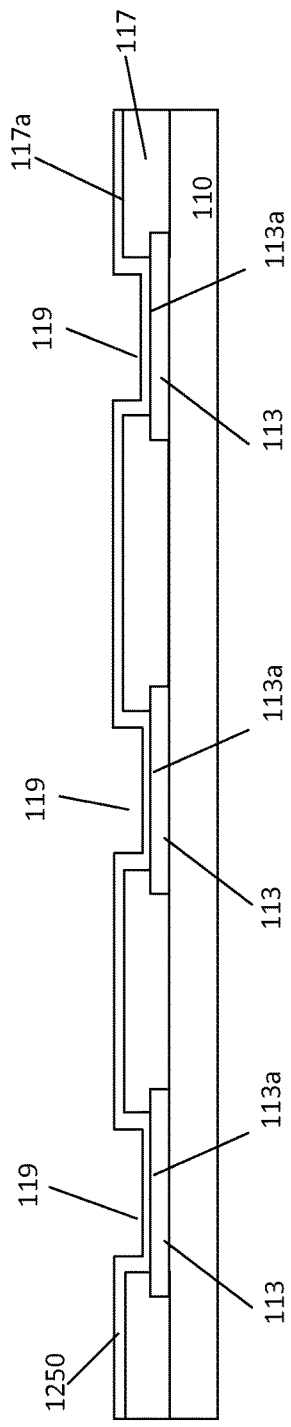

Referring to FIG. 12b, a buffer layer 1250 is deposited over the partially processed substrate 110. In one embodiment, the buffer layer is blanket deposited over the top surface 117 of the final passivation layer, lining the sidewalls of the openings 119 as well as over the exposed top surface 113a of the contact regions. The buffer layer 1250 is formed over the partially processed substrate 110 by CVD process. The buffer layer, in one embodiment, includes a compliant material which is deformable when force is exerted thereon. For example, the buffer layer includes polyimide, B-stage material, polymer with filler content, etc. Other suitable types of compliant material and other suitable deposition techniques may also be employed. The buffer layer 1250, for example, includes a thickness which is thinner than a thickness of the final passivation layer. Other suitable thickness dimensions may be employed for the buffer layer.

Figure 12C:
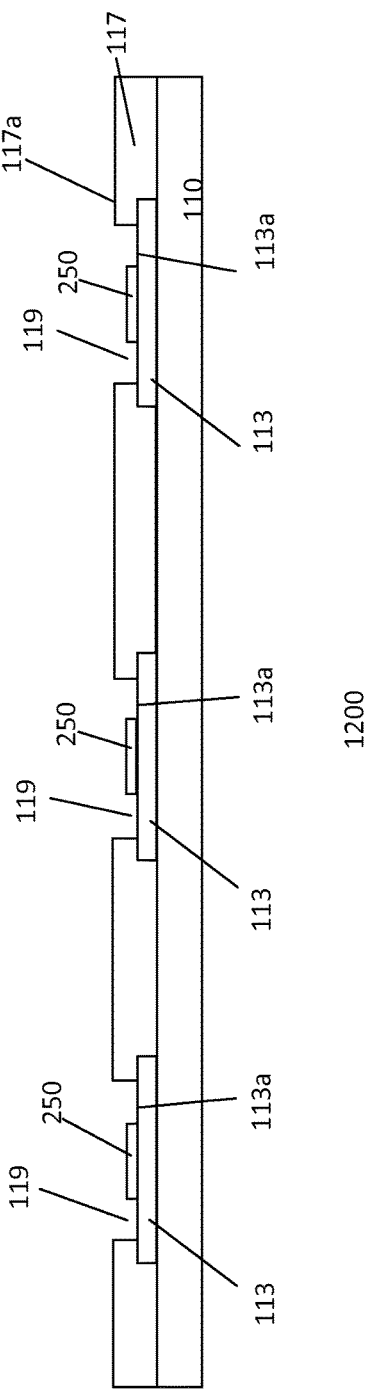

The process continues to pattern the buffer layer 1250 to form individual buffer layer 250 as shown in FIG. 12c. To form the individual buffer layer 250, mask and etch techniques can be employed. For example, a soft mask (not shown), such as photoresist, can be used. The photoresist, for example, can be formed by various techniques, such as spin-on. Other techniques are also useful. The mask layer is selectively exposed and developed to create the desired pattern corresponding to the pattern of the individual buffer layer. In one embodiment, the mask includes a pattern which protects or covers the portions of the buffer layer 1250 which define the individual buffer layer 250. Exposed portions of the buffer layer 1250 which are not covered by the mask pattern are removed by, for example, an etch. Other suitable techniques for forming the buffer layer with desired pattern are also useful. For example, screen printing or dispensing may also be used to form the buffer layer with desired pattern.

In one embodiment, portions of the buffer layer 1250 disposed over the contact region 113 and within the opening 119 are protected by the mask during the patterning process. The patterned buffer layer 250, in one embodiment, covers a portion of the exposed surface of the contact region while portions of the exposed top surface of the contact region not covered by the buffer layer 250 remain exposed. In one embodiment, the patterned buffer layer includes an upper planar surface and is disposed over a central portion of the exposed surface of the contact region. Forming the buffer layer having other desired pattern or profile and at other location of the exposed surface of the contact region may also be useful so long as it allows for forming electrical coupling between the contact region and electrically conductive interconnection during subsequent processing later. Alternatively, the buffer layer 1250 may be patterned such that portions of the buffer layer remain within the openings 119 as well as over portions of the top surface 117a of the final passivation layer 117. In another embodiment, the buffer layer is formed such as to fully cover the probe marks caused by the electrical test.

Figure 12D:
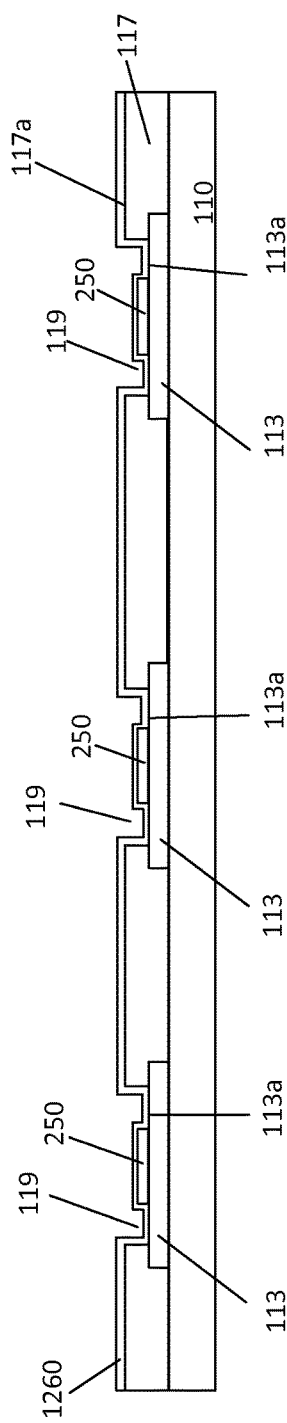

Referring to FIG. 12d, a barrier layer 1260 is formed over the partially processed substrate 110. In one embodiment, the barrier layer 1260 is blanket deposited over the top surface 117 of the final passivation layer, lining the sidewalls of the openings 119 as well as over the exposed top surface 113a of the contact regions and covering the buffer layer 250. The barrier layer 1260 is formed over the partially processed substrate 110 by PVD process. The barrier layer, in one embodiment, includes a single layer barrier layer. In other embodiments, multiple layers of barrier materials may be deposited to form a multi-layered stack. The barrier layer 1260, in one embodiment, includes any suitable types of material(s) which can prevent the material of the electrically conductive interconnection from diffusing into the layers underneath the contact regions and provides a bondable surface for the electrically conductive interconnection. For example, the barrier layer includes material(s) which can prevent Cu diffusion and provides a bondable surface for Cu wire bond, such as Ni, Pd, Au, Zn, alloys thereof, etc. The barrier layer 1260, for example, may include any sufficient thickness so long as it is capable to act as an effective barrier as well as to provide a bondable surface.

Figure 12E:
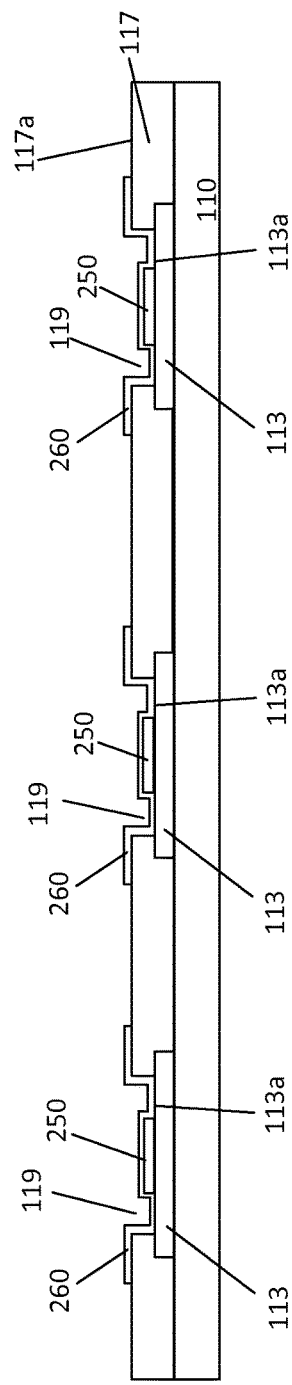

The process continues to pattern the barrier layer 1260 to form individual barrier layer 260 as shown in FIG. 12e. To form the individual barrier layer 260, mask and etch techniques can be employed. For example, a soft mask (not shown), such as photoresist, can be used. The photoresist, for example, can be formed by various techniques, such as spin-on. Other techniques are also useful. The mask layer is selectively exposed and developed to create the desired pattern corresponding to the pattern of the individual barrier layer. In one embodiment, the mask includes a pattern which sufficiently isolates the contact regions from each other. Exposed portions of the barrier layer 1260 which are not covered by the mask pattern are removed by, for example, an etch. Other suitable techniques for patterning the barrier layer are also useful.

The patterned barrier layer 260 is disposed over the final passivation layer 117 and lines the opening of the final passivation layer. In one embodiment, the barrier layer 260 is disposed over a portion of the top surface 117a of the final passivation layer and lines the opening 119, including the sidewalls of the opening as well as exposed portions of the contact region and covering the buffer layer 250.

The process continues to form the semiconductor package. Further processing can include dicing, forming electrically conductive interconnections over the contact regions, assembly and packaging. For example, electrically conductive interconnection, such as the first end of a wire bond having a ball bond may be bonded to the contact region, so that a portion of the semiconductor package such as that shown in FIG. 2 may be formed. Other additional processes may also be performed.

The process as described in FIGS. 12a-12e may be modified to form portions of a semiconductor package such as that described in FIGS. 3-5 and FIGS. 8-11. For the portion 300 described in FIG. 3, the process may be modified to form a buffer layer as described in FIG. 12b and the buffer layer is patterned to form the desired forms or patterns 350a-350d over a portion of the exposed surface of the contact regions. To form the buffer layer having convex or concave upper profile such as that shown in FIG. 4 or FIG. 5, the process steps as described in FIGS. 12b and 12c may be modified to include buffer layer made of, for example, B-stage material and to employ techniques such as dispensing, screen printing, curing, coining process or any combination thereof during the formation of the buffer layer. For the portion 800 described in FIG. 8, the process may be modified to provide a buffer layer with filler content and the buffer layer with filler content is patterned such that the patterned buffer layer is partially disposed over the final passivation layer, lining the sidewalls of the opening as well as covering the exposed portions of the contact region. To form the contact regions having the buffer layer with filler content such as that shown in FIG. 9, the process step as described in FIG. 12a may be modified to include buffer layer with filler content being directly disposed over the last interconnect level and patterned to define the plurality of contact regions. On the other hand, to form the buffer layer such as that shown in FIG. 10 or FIG. 11, the process steps as described in FIGS. 12b and 12c may be modified to include a buffer layer which exhibit high strength and stiffness, high charge mobility and high thermal conductivity or with high electrical conductivity, low resistance and mechanical compliance for semiconductor applications, such as graphene or carbon nanotube layer and is patterned to achieve the desired pattern shown in FIG. 10 or FIG. 11.

Figure 13D:
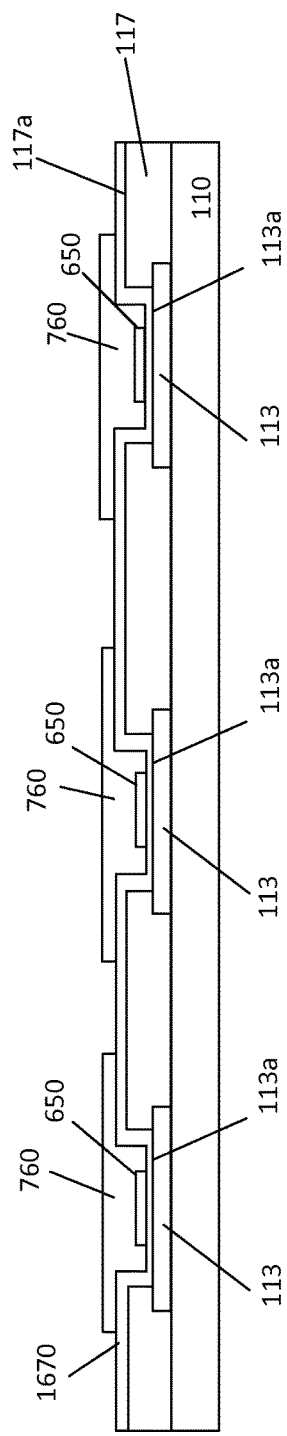

FIGS. 13a-13e show another embodiment of a process 1300 for forming a portion of a semiconductor package. The portion of the semiconductor package formed is similar to that described in FIG. 7. Referring to FIG. 13a, a partially processed substrate is provided. The partially processed substrate is processed at the stage which is the same as that already described in FIG. 12a. As such, common elements may not be described or described in detail.

Referring to FIG. 13b, a conductive layer 1670 is deposited over the partially processed substrate 110. In one embodiment, the conductive layer is blanket deposited over the top surface 117 of the final passivation layer, lining the sidewalls of the openings 119 as well as over the exposed top surface 113a of the contact regions. The conductive layer may be formed to cover the probe marks caused by the electrical test. The conductive layer 1670 is formed over the partially processed substrate 110 by PVD process. The conductive layer, in one embodiment, includes a single layer conductive layer. Multiple conductive layers may be deposited to form a multi-layered conductive stack. The conductive layer 1670, in one embodiment, serves as a seed layer for subsequent processing of a barrier layer as will be described later. The conductive layer, for example, includes Cu, AlCu, etc. Other suitable conductive materials and forming techniques may also be employed. The deposited conductive layer 1670, for example, includes sufficient thickness to serve as a seed layer. It is an option to increase the thickness of the conductive layer 1670 by using plating process, preferably by electrolytic plating.

The process continues to form a buffer layer over the partially processed substrate. In one embodiment, the buffer layer is blanket deposited over the conductive layer 1670. The buffer layer includes suitable materials and is formed by suitable techniques described in FIG. 12b. As such, the details of the materials and forming techniques will not be described. The buffer layer is processed to form individual buffer layer 650 as shown in FIG. 13c. To form the individual buffer layer 650, mask and etch techniques can be employed. For example, a soft mask (not shown), such as photoresist, can be used. The photoresist, for example, can be formed by various techniques, such as spin-on. Other techniques are also useful. The mask layer is selectively exposed and developed to create the desired pattern corresponding to the pattern of the individual buffer layer. In one embodiment, the mask includes a pattern which protects or covers the portions of the buffer layer which define the individual buffer layer 650. Exposed portions of the buffer layer which are not covered by the mask pattern are removed by, for example, an etch. Other suitable techniques for forming the buffer layer with desired pattern are also useful.

In one embodiment, portions of the buffer layer disposed over the conductive layer 1670 and the contact region 113 and within the opening 119 are protected by the mask during the patterning process. The patterned buffer layer 650, in one embodiment, is disposed over a portion of the conductive layer 1670 which is over a portion of the exposed surface of the contact region while portions of the conductive layer 1670 not covered by the buffer layer 650 remain exposed. In one embodiment, the patterned buffer layer 650 includes an upper planar surface and is disposed over a central portion of the exposed surface of the contact region. Forming the buffer layer having other desired pattern or profile and at other location of the exposed surface of the contact region may also be useful.

Referring to FIG. 13d, a barrier layer 760 is formed over the partially processed substrate 110. In one embodiment, the barrier layer 760 is formed by a plating process or a combination of PVD and plating process. For example, electrochemical or electroless plating may be employed to form the barrier layer 760. Thus, one or more layers may be plated to form the barrier layer. In one embodiment, a plating mask (not shown) having a mask pattern is provided over the conductive layer 1670 and the barrier layer 760 may be formed by electrochemical plating in which the conductive layer serves as a plating current conducting path in the process. Other suitable methods for forming the barrier layer 760 may also be used. The plated barrier layer fills the remaining openings as well as over portions of the top surface of the final passivation layer not protected by the plating mask. The plated upper surface of the barrier layer 760 is substantially planar or flat as shown in FIG. 13d.

Figure 13E:
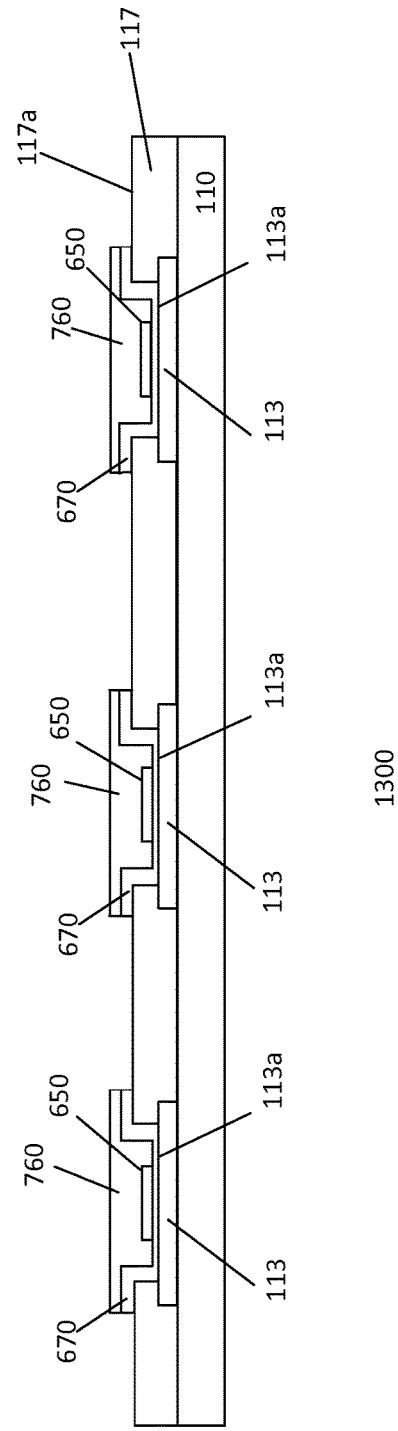

The process continues to pattern the conductive layer 1670 to form individual conductive layer 670 as shown in FIG. 13e. In one embodiment, the thickness of the conductive layer is thinner than the plated barrier layer. To form the individual conductive layer 670, the plated barrier layer 760 may serve as an etch mask. This avoids the use of an additional patterned mask. The process is simplified since no additional mask is required and the thickness of the conductive layer being thinner than the plated barrier layer reduces material wastage on etching, further reducing the cost of production. In one embodiment, the plated barrier layer is used as the etch mask such that portions of the conductive layer not covered by the plated barrier layer are removed by an etch. The patterned conductive layer sufficiently isolates the contact regions from each other. Other suitable techniques for patterning the conductive layer are also useful.

The process continues to form the semiconductor package. Further processing can include dicing, forming electrically conductive interconnections over the contact regions, assembly and packaging. For example, electrically conductive interconnection, such as the first end of a wire bond having a ball bond may be bonded to the contact region, so that a portion of the semiconductor package such as that shown in FIG. 7 may be formed. Other additional processes may also be performed.

The process as described in FIGS. 13a-13e may be modified to form a portion of a semiconductor package such as that described in FIG. 6. For the portion 600 described in FIG. 6, the process may be modified to form a plated barrier layer having an upper surface profile as described in FIG. 6. Furthermore, the process as described in FIGS. 13a-13e may be modified to form portions of a semiconductor package such as that described in FIGS. 3-5 and FIGS. 8-11. These modifications will not be described or described in detail.

The embodiments described with respect to FIGS. 12a-12e and FIGS. 13a-13e include some or all advantages as described with respect to FIGS. 2-11. As such, these advantages will not be described or described in detail.

For illustration purpose, the devices as described are presented as wire-bonding type of devices. It is understood that the embodiments as described are flexible and may also be useful for other types of devices, including but not limited to flip chip type of devices.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
an underlying device layer having an underlying device layer top surface;
a contact region disposed on the underlying device layer top surface, wherein the contact region includes a contact pad having a contact pad top surface;
a final passivation layer disposed on the underlying device layer top surface and partially overlapping the contact pad, wherein the final passivation layer includes a final passivation layer opening which defines an exposed portion of the contact pad top surface;
a buffer layer disposed over the contact pad and in the final passivation layer opening, wherein the buffer layer is a single continuous non-metal layer comprising a resilient material, and the buffer layer is separate and distinct from the final passivation layer;
a diffusion barrier layer disposed over the buffer layer and in the final passivation layer opening, wherein the diffusion barrier layer covers a top surface of the buffer layer and extends over a portion of a passivation layer top surface surrounding the final passivation layer opening; and
a wire bond directly coupled to the diffusion barrier layer.

2. The device of claim 1 wherein the buffer layer is disposed completely within the final passivation layer opening without contacting the final passivation layer.

3. The device of claim 2 wherein:
the wire bond comprises a ball bond which is in direct contact with a top surface portion of the barrier layer disposed within the final passivation layer opening; and
wherein the ball bond overlaps the buffer layer without contacting the buffer layer.

4. The device of claim 2 wherein the buffer layer directly contacts the contact pad and partially covers the exposed portion of the contact pad top surface.

5. The device of claim 1 wherein a top surface of the buffer layer comprises a convex profile or a concave profile.

6. The device of claim 1 wherein the buffer layer is deformable when a force is exerted thereon.

7. The device of claim 1 wherein:
the buffer layer comprises B-stage material; and
the buffer layer comprises a non-planar top surface profile defined by the B-stage material.

8. The device of claim 1 comprising:
a conductive layer, wherein the conductive layer lines sidewalls of the final passivation layer opening and covers the exposed portion of the contact pad top surface.

9. The device of claim 8 wherein the buffer layer is disposed directly on the conductive layer and completely within the final passivation layer opening.

10. The device of claim 1 wherein:
the buffer layer completely covers the exposed portion of the contact pad top surface and lines sidewalls of the final passivation layer opening, wherein the buffer layer is a conformal buffer layer of which an upper surface of the buffer layer includes a profile which is conformal to the topography of the underlying layer.

11. The device of claim 1 wherein the resilient material of the buffer layer comprises graphene or carbon nanotube.

12. The device of claim 1 wherein the diffusion barrier layer does not contact the passivation layer.

13. A device comprising:
an underlying device layer having an underlying device layer top surface;
a contact region disposed on the underlying device layer top surface, wherein the contact region includes a contact pad having a contact pad top surface;
a final passivation layer disposed on the underlying device layer top surface and the contact pad, wherein the final passivation layer includes a final passivation layer opening which defines an exposed portion of the contact pad top surface;
a buffer layer disposed over the contact pad and completely within the final passivation layer opening, wherein the buffer layer is a single continuous non-metal layer which comprises a material different from the final passivation layer, and the buffer layer is separate and distinct from the final passivation layer;
a barrier layer disposed over the contact pad, wherein the barrier layer covers a top surface of the buffer layer and extends over a portion of a passivation layer top surface surrounding the final passivation layer opening; and
a wire bond directly coupled to the barrier layer, wherein a portion of the wire bond contacts a portion of the barrier layer overlapping the buffer layer.

14. The device of claim 13 comprising a conductive layer separating the diffusion barrier layer from the passivation layer top surface.

15. A method for forming a device comprising:
- forming an underlying device layer having an underlying device layer top surface;
- forming a contact pad within a contact region disposed on the underlying device layer top surface, wherein the contact pad includes a contact pad top surface;
- forming a final passivation layer on the underlying device layer top surface and over the contact pad, wherein an opening is formed in the final passivation layer to expose a portion of the contact pad top surface;
- performing a deposition process to form a buffer layer over the contact pad and in the final passivation layer opening, wherein the buffer layer is a non-metal layer comprising a resilient material, and the buffer layer is a separate and distinct layer from the final passivation layer;
- forming a diffusion barrier layer, wherein the diffusion barrier layer covers a top surface of the buffer layer and extends over a portion of a passivation layer top surface surrounding the final passivation layer opening; and
- forming a wire bond directly coupled to the diffusion barrier layer, wherein a portion of the wire bond contacts a portion of the diffusion barrier layer overlapping the buffer layer.

16. The method of claim 15 wherein the buffer layer is formed completely within the final passivation layer opening and partially overlaps the exposed portion of the contact pad top surface.

17. The method of claim 16 comprising:
- forming a conductive layer over the final passivation layer opening prior to forming the buffer layer, wherein the conductive layer lines sidewalls of the final passivation layer opening and completely covers the exposed portion of the contact pad top surface.

18. The method of claim 17 wherein the buffer layer is formed directly on the conductive layer and covers a first portion of the conductive layer, wherein the diffusion barrier layer covers the buffer layer and a second portion of the conductive layer.

19. The method of claim 15 wherein the deposition process to form the buffer layer comprises depositing the non-metal layer over the final passivation layer, wherein the non-metal layer lines sidewalls of the final passivation layer opening and covers the exposed portion of the contact pad top surface, wherein
the non-metal layer is patterned to define the buffer layer.

20. The method of claim 15 wherein the diffusion barrier layer does not contact the passivation layer.

21. A method for forming a device comprising:
- forming an underlying device layer having an underlying device layer top surface;
- forming a contact pad within a contact region disposed on the underlying device layer top surface, wherein the contact pad includes a contact pad top surface;
- forming a final passivation layer on the underlying device layer top surface and over the contact pad, wherein an opening is formed in the final passivation layer to expose a portion of the contact pad top surface;
- performing a deposition process to form a buffer layer in the final passivation layer opening, wherein the buffer layer partially overlaps the exposed portion of the contact pad top surface, the buffer layer includes a material different from a material of the final passivation layer, wherein the opening in the final passivation layer is formed prior to forming the buffer layer, and the buffer layer is formed completely within the opening of the final passivation layer;
- forming a conductive barrier layer over the contact pad, wherein the conductive barrier layer covers a major surface of the buffer layer and extends over a portion of a passivation layer top surface surrounding the final passivation layer opening; and
- forming a wire bond directly coupled to the conductive barrier layer, wherein a portion of the wire bond contacts a portion of the conductive barrier layer overlapping the buffer layer.

22. The method of claim 21 comprising forming a conductive layer over the final passivation layer opening prior to forming the buffer layer, wherein the conductive layer separates the diffusion barrier layer from the passivation layer top surface.

* * * * *